United States Patent
Johnson, Jr.

(10) Patent No.: US 7,561,411 B2
(45) Date of Patent: Jul. 14, 2009

(54) UNINTERRUPTIBLE POWER DISTRIBUTION SYSTEMS AND METHODS USING DISTRIBUTED POWER DISTRIBUTION UNITS

(75) Inventor: Robert W. Johnson, Jr., Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 203 days.

(21) Appl. No.: 11/689,087

(22) Filed: Mar. 21, 2007

(65) Prior Publication Data

US 2007/0217125 A1    Sep. 20, 2007

Related U.S. Application Data

(63) Continuation-in-part of application No. 11/378,139, filed on Mar. 17, 2006, now Pat. No. 7,252,524, and a continuation-in-part of application No. 11/378,140, filed on Mar. 17, 2006.

(51) Int. Cl.
*H02B 1/00* (2006.01)
(52) U.S. Cl. .................................. 361/600; 307/66
(58) Field of Classification Search ................ 361/600, 361/602; 439/21; 307/46, 66
See application file for complete search history.

(56) References Cited

U.S. PATENT DOCUMENTS

| | | | |
|---|---|---|---|
| 6,967,283 B2* | 11/2005 | Rasmussen et al. | 174/50 |
| 7,236,896 B2* | 6/2007 | Farkas et al. | 702/60 |
| 7,400,066 B2* | 7/2008 | Tassitino et al. | 307/46 |
| 2002/0134567 A1 | 9/2002 | Rasmussen et al. | |
| 2005/0036253 A1 | 2/2005 | Tian et al. | |
| 2005/0162836 A1 | 7/2005 | Briggs et al. | |
| 2005/0200205 A1* | 9/2005 | Winn et al. | 307/64 |
| 2007/0013233 A1 | 1/2007 | Belady et al. | |
| 2007/0114852 A1* | 5/2007 | Lin et al. | 307/66 |

FOREIGN PATENT DOCUMENTS

| | | |
|---|---|---|
| EP | 1835793 A2 | 9/2007 |
| GB | 2278501 A | 11/1994 |

OTHER PUBLICATIONS

International Search Report and Written Opinion; PCT/IB2008/000661; Nov. 26, 2008.

* cited by examiner

*Primary Examiner*—Michael C Zarroli
(74) *Attorney, Agent, or Firm*—Myers Bigel Sibley & Sajovec, P.A.

(57) ABSTRACT

A system includes a plurality of equipment racks and a plurality of PDUs mounted in respective ones of the plurality of equipment racks and configured to distribute power via plural branch circuit outputs. The system further includes a UPS rack, a plurality of UPSs mounted in the UPS rack and a plurality of power cables directly coupling outputs of respective ones of the UPSs to inputs of respective ones of the PDUs. Each UPS may include a first output connector directly connected to a PDU via a power cable, and a second output connector coupled to a second connector of another UPS to provide output paralleling. For example, a connectorized bus assembly may be mounted in the UPS rack and may include a UPS output bus and a plurality of connectors, respective ones of the connectors coupling the UPS output bus to the outputs of respective ones of the UPSs.

31 Claims, 10 Drawing Sheets

UNINTERRUPTIBLE POWER DISTRIBUTION SYSTEMS AND METHODS USING DISTRIBUTED POWER DISTRIBUTION UNITS

RELATED APPLICATION

This application is a continuation-in-part application of U.S. patent application Ser. No. 11/378,139, filed Mar. 17, 2006 now U.S. Pat No 7,252,524 and U.S. patent application Ser. No. 11/378,140, filed Mar. 17, 2006, the disclosures of both of which are hereby incorporated herein by reference in their entireties.

BACKGROUND OF THE INVENTION

The invention relates to power systems and methods and, more particularly, to power systems and methods for applications such as data centers and telecommunications installations.

Several different approaches have been used to provide power in mid- to large-scale data center and telecommunications applications. Some approaches involve coupling the output of a relatively large uninterruptible power supply (UPS) to a wall-mounted breaker panel or a rack- or cabinet-type power distribution unit (PDU), which includes a plurality of breakers that provide power to plural branch circuits. Respective racks or other groupings of electronic equipment, such as servers, routers, switches, storage devices and the like, may be served by respective ones of these branch circuits. An example of such an implementation is described, for example, in U.S. Pat. No. 6,967,283 to Rasmussen et al. In other applications, respective individual UPSs may be mounted in respective racks that hold computer equipment, such as servers, with the UPS providing power to the equipment in the rack directly or via a rack-mounted PDU.

SUMMARY OF THE INVENTION

In some embodiments of the present invention, a power system includes a plurality of power distribution units (PDUs) configured to be mounted in respective ones of a plurality of equipment racks and to distribute power via plural branch circuit outputs. The system further includes a plurality of uninterruptible power supplies (UPSs) configured to be mounted in a UPS rack and to be directly connected to inputs of respective ones of the PDUs via respective power cables. The UPSs may be configured to be output-paralleled at the UPS rack. For example, each UPS may include a first output connector configured to be directly connected to a PDU via a power cable, and a second output connector configured to be connected to a second connector of another UPS to provide output paralleling. In some embodiments, the system may include a connectorized bus assembly configured be mounted in the UPS rack. The connectorized bus assembly may include a UPS output bus and a plurality of connectors, respective ones of the connectors configured to couple the UPS output bus to the outputs of respective ones of the UPSs. The connectorized bus assembly may further include a UPS input bus, and the respective ones of the plurality of connectors may be further configured to couple the UPS input bus to inputs of respective ones of the UPSs. Each of the UPSs may include a first output connector configured to mate with a connector of the connectorized bus assembly and a second output connector configured to mate with a connector of one of the power cables. The system may further include a plurality of outlet assemblies configured to be mounted in an equipment rack, respective ones of the outlet assemblies configured to be coupled to respective ones of the branch circuit outputs of a PDU in the equipment rack.

According to further embodiments, each of the UPSs includes at least one removable module. The outputs of the UPSs may be configured to be output paralleled in the UPS rack such that power supply to a PDU coupled to a UPS is maintained while the at least one removable module of the UPS is absent. The at least one removable module may include a battery module and/or a power converter module.

In further embodiments of the present invention, a system includes a plurality of equipment racks and a plurality of PDUs mounted in respective ones of the plurality of equipment racks and configured to distribute power via plural branch circuit outputs. The system further includes a UPS rack, a plurality of UPSs mounted in the UPS rack and a plurality of power cables directly coupling outputs of respective ones of the UPSs to inputs of respective ones of the PDUs.

In some embodiments, the plurality of PDUs includes respective pairs of first and second PDUs mounted in respective ones of the equipment racks, the first and second PDUs configured to distribute power to equipment via respective first and second pluralities of branch circuit outputs and the UPS rack includes first and second UPS racks. The plurality of UPSs may include a first plurality of UPSs mounted in the first UPS rack and a second plurality of UPSs mounted in the second UPS rack. The plurality of power cables may include a first plurality of power cables coupling outputs of respective ones of the first plurality of UPSs to inputs of respective ones of the first PDUs and a second plurality of power cables coupling outputs of respective ones of the second plurality of UPSs to inputs of respective ones of the second PDUs.

In still further embodiments, the plurality of PDUs includes a plurality of pairs of first PDUs and second PDUs, respective ones of the pairs of first and second PDUs being mounted in respective ones of the equipment racks. The plurality of UPSs includes a first plurality of UPSs mounted in the UPS rack, and the system further includes a second plurality of UPSs, respective ones of which are mounted in respective ones of the equipment racks. Outputs of respective ones of the second plurality of UPSs are connected to inputs of respective ones of the second PDUs.

Additional embodiments of the present invention provide methods of fabricating infrastructure for equipment. Respective PDUs are mounted in respective ones of a plurality of equipment racks. The PDUs are configured to distribute power via plural branch circuit outputs thereof. Plural UPSs are mounted a UPS rack. Respective power cables are connected between outputs of respective ones of the UPSs and inputs of respective ones of the PDUs.

DETAILED DESCRIPTION OF EXEMPLARY EMBODIMENTS

Figure 1:
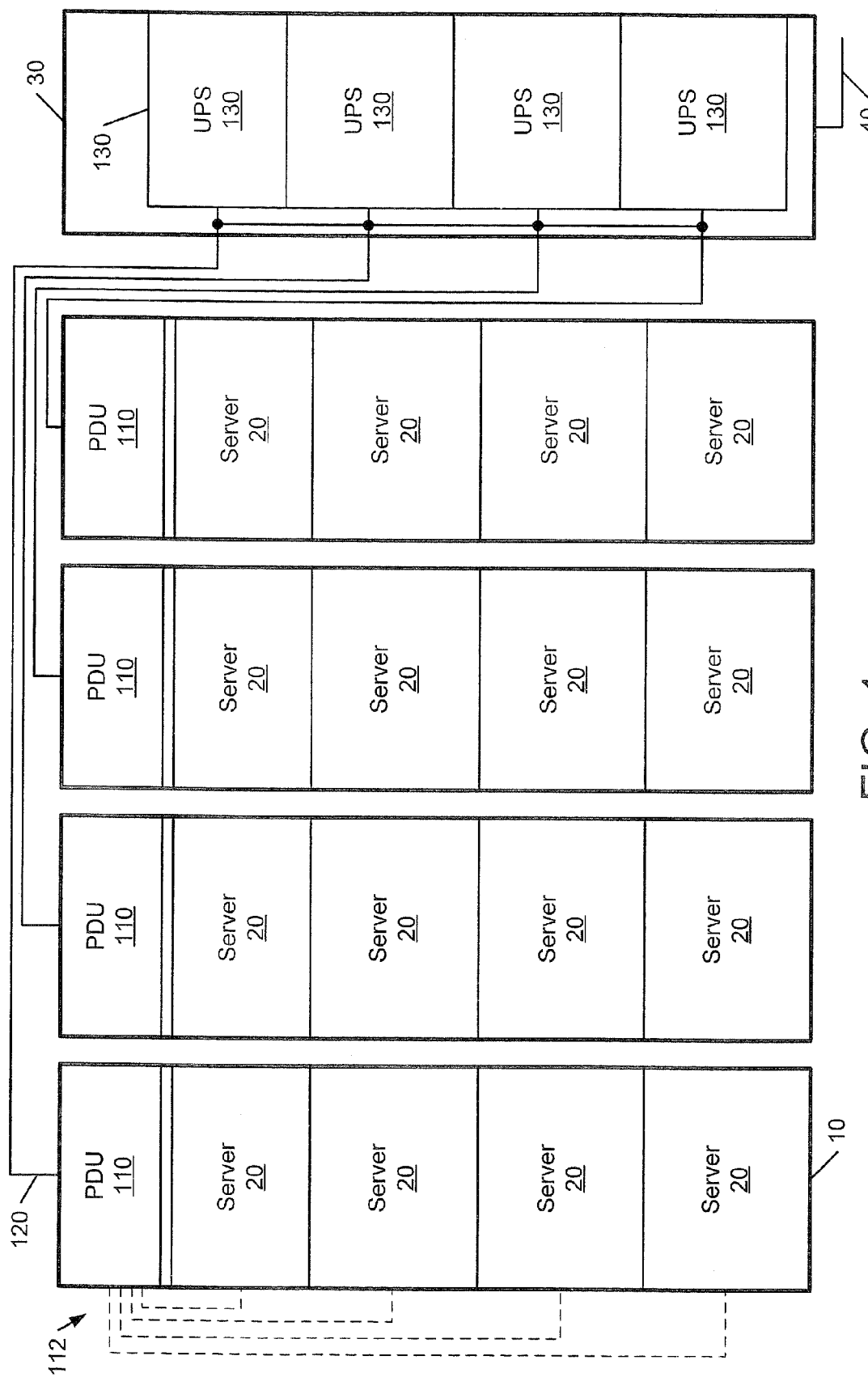
FIG. 1 is a schematic diagram illustrating a power supply system according to some embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

As will be appreciated by one of skill in the art, the invention may be embodied as system and methods. Embodiments of the invention may include hardware and/or software. Embodiments of the invention include circuitry configured to provide functions described herein. It will be appreciated that such circuitry may include analog circuits, digital circuits, and combinations of analog and digital circuits.

Some embodiments of the invention arise from a realization that scaleable uninterruptible power supply systems can be achieved by providing respective power distribution units (PDUs) in respective ones of a plurality of equipment racks, e.g., racks that include equipment such as servers or other data center equipment. A complementary modular UPS arrangement may be provided wherein respective modular UPSs mounted in one or more UPS racks are directly connected to respective ones of the PDUs. When an additional equipment rack is added to an installation, the uninterruptible power system may be expanded by adding an additional modular UPS to the UPS rack and connecting a power cable between the new UPS and the PDU of the new equipment rack. This approach can provide incremental expansion in a cost-effective and flexible manner.

According to further embodiments of the invention, a connectorized bus assembly may be included in the UPS rack and used for output paralleling of UPSs. This arrangement may support advantageous maintenance and replacement operations. For example, in some embodiments, the UPSs may include one or more removable modules, such as converter or battery modules. By output paralleling UPSs in the UPS rack using the connectorized bus assembly, a module may be removed from a UPS for maintenance or replacement while continuing to serve that UPS from the other UPSs in the UPS rack.

FIG. 1 illustrates data center infrastructure including a power supply system according to some embodiments of the present invention. A plurality of equipment racks 10, for example, standard 19-inch or 23-inch racks, include equipment, here shown as server modules 20, mounted therein. Respective power distribution units (PDUs) 110 are mounted in respective ones of the equipment racks 10. The PDUs 110 are configured to distribute power to the server modules 20 via a plurality of branch circuit outputs 112, as shown in dashed line. Respective power cables 120 connect respective ones of the PDUs 110 to respective UPSs 130 mounted in a UPS rack 30. The UPSs 130 provide uninterruptible power to the PDU responsive to power provided from a utility or other source via a power input 40. As shown, the UPSs 130 may be output paralleled such that, for example, if one of the UPSs 130 fails or is deactivated, the others of the UPSs 130 may provide power to the PDU 110 directly connected to the failed or deactivated UPS 130.

It will be appreciated that embodiments of the present invention may be implemented for applications other than the data center application described above. For example, it will be appreciated that various other types of computer or telecommunications equipment, such as routers, data storage devices and the like may be mounted in equipment racks such as the racks 10 of FIG. 1, and may receive power in a manner similar to that described above for the server modules 20. It will be further understood that the racks 10, 30 may be relatively arranged in any of a number of different ways, some examples of which are described below with reference to FIGS. 5-8. The UPSs 130 may have any of a number of different configurations including, but not limited to, on-line, standby and line-interactive configurations, and may have identical or different capacities.

Figure 2:
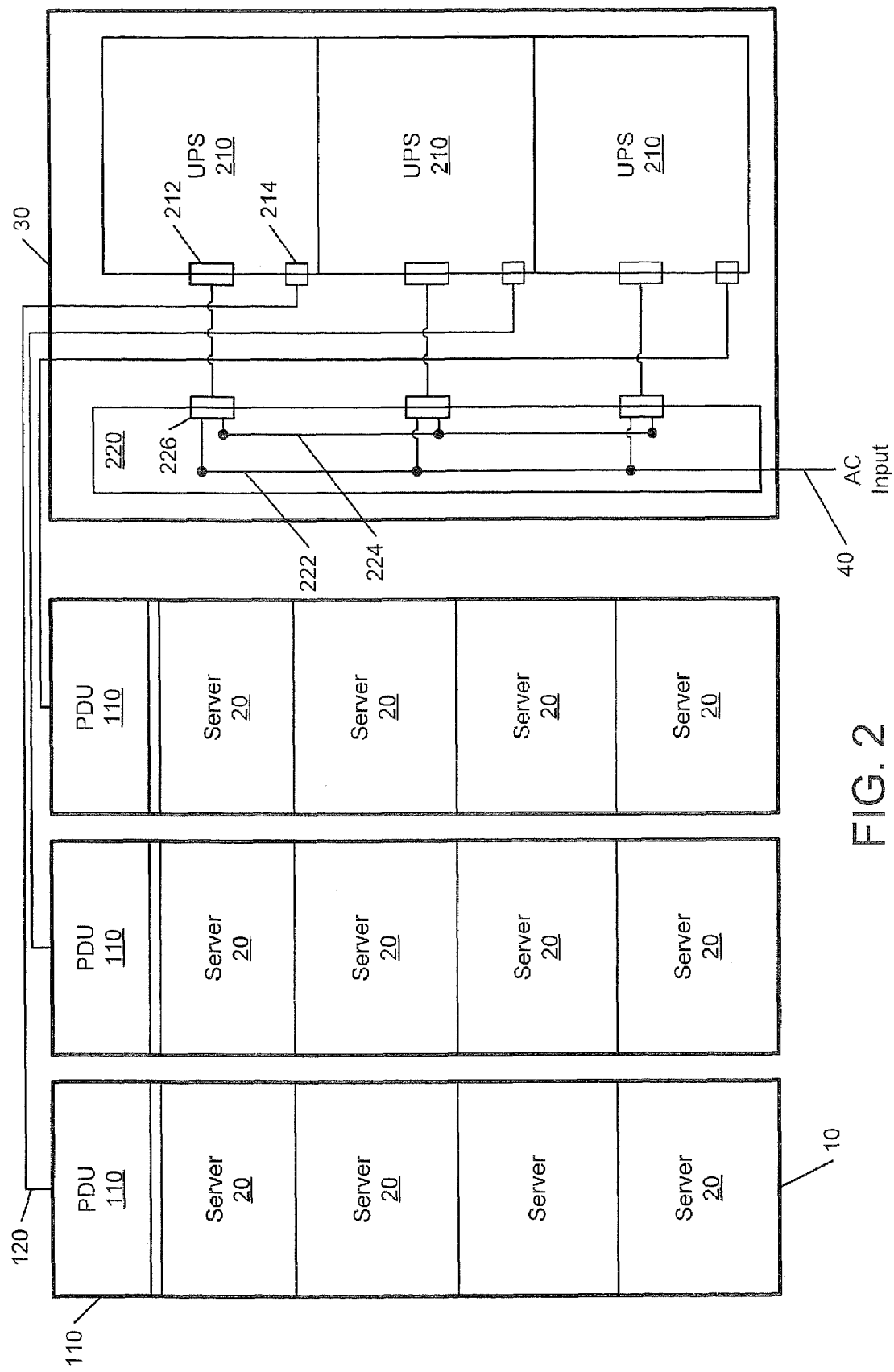
FIG. 2 is a schematic diagram illustrating a power supply system with a UPS rack and a connectorized bus assembly according to further embodiments of the present invention.

FIG. 2 illustrates an implementation of a UPS rack 30 according to some embodiments of the present invention. A plurality of modular UPSs 210 are mounted in the UPS rack 30. A connectorized bus assembly 220 is also mounted in the UPS rack 30. The connectorized bus assembly 220 includes a UPS input bus 222, which is powered by an external AC source via an input 40, and a UPS output bus 224. The connectorized bus assembly 220 further includes a plurality of connectors 226, respective ones of which provide power input and output connections for respective ones of the UPSs 210 to the UPS input and output busses 222, 224. The connectorized bus assembly 220 may include, for example, a power interconnect assembly such as that described in U.S. patent application Ser. No. 11/378,139 and U.S. patent application Ser. No. 11/378,140, each filed Mar. 17, 2006 and incorporated herein by reference in its entirety as if the text thereof were physically present.

As illustrated, the UPSs 210 include first and second connectors 212, 214. The first connectors 212 are configured to be coupled to respective ones of the connectors 226 of the connectorized bus assembly 220, and includes conductors for both input and output power connections to the UPS input and output busses 222, 224 of the connectorized bus assembly 220. The second connectors 214 are configured to be connected to PDUs 110 in respective equipment racks 10 via respective power cables 120 to connect power outputs of the UPSs 210 to the PDUs 110.

Figure 3:
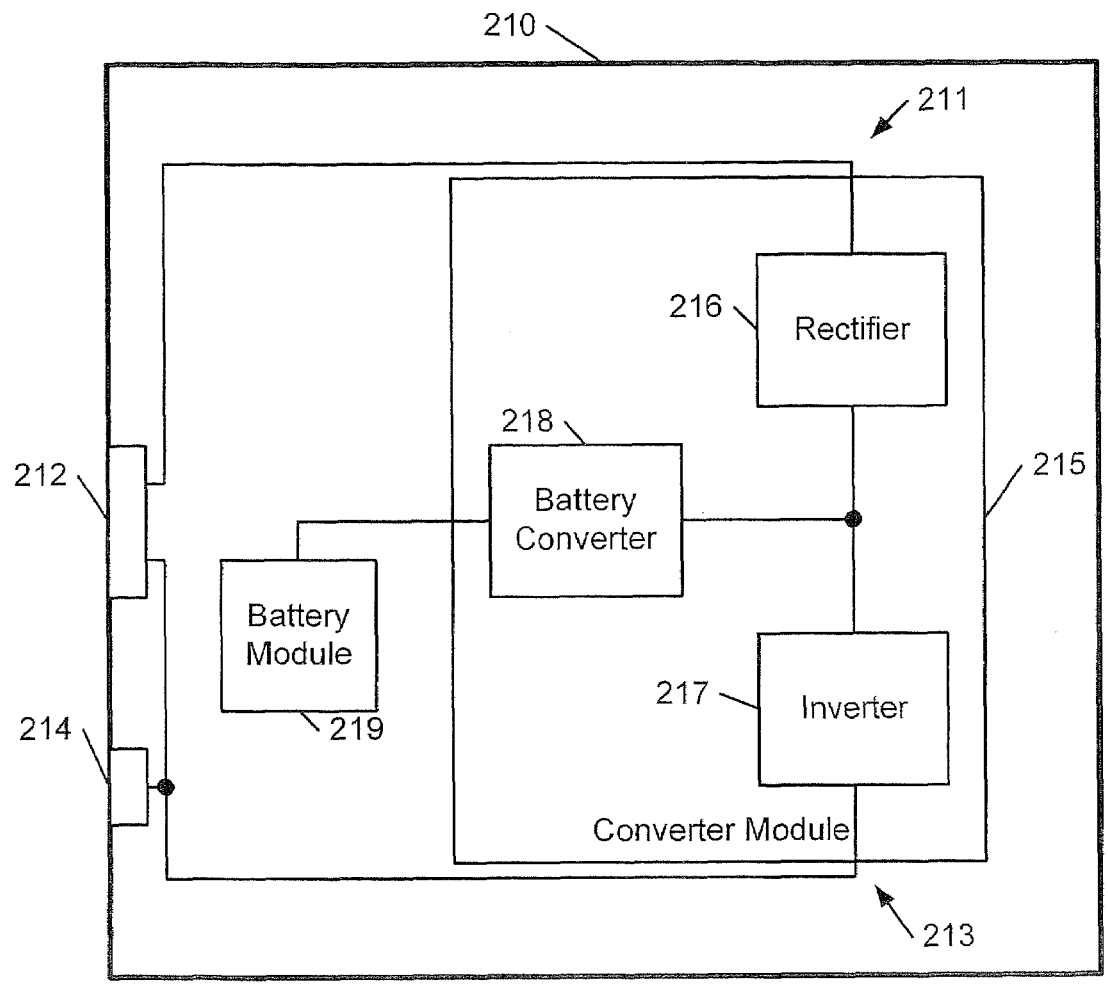
FIG. 3 is a schematic diagram illustrating a modular UPS according to some embodiments of the present invention.
Figure 4:
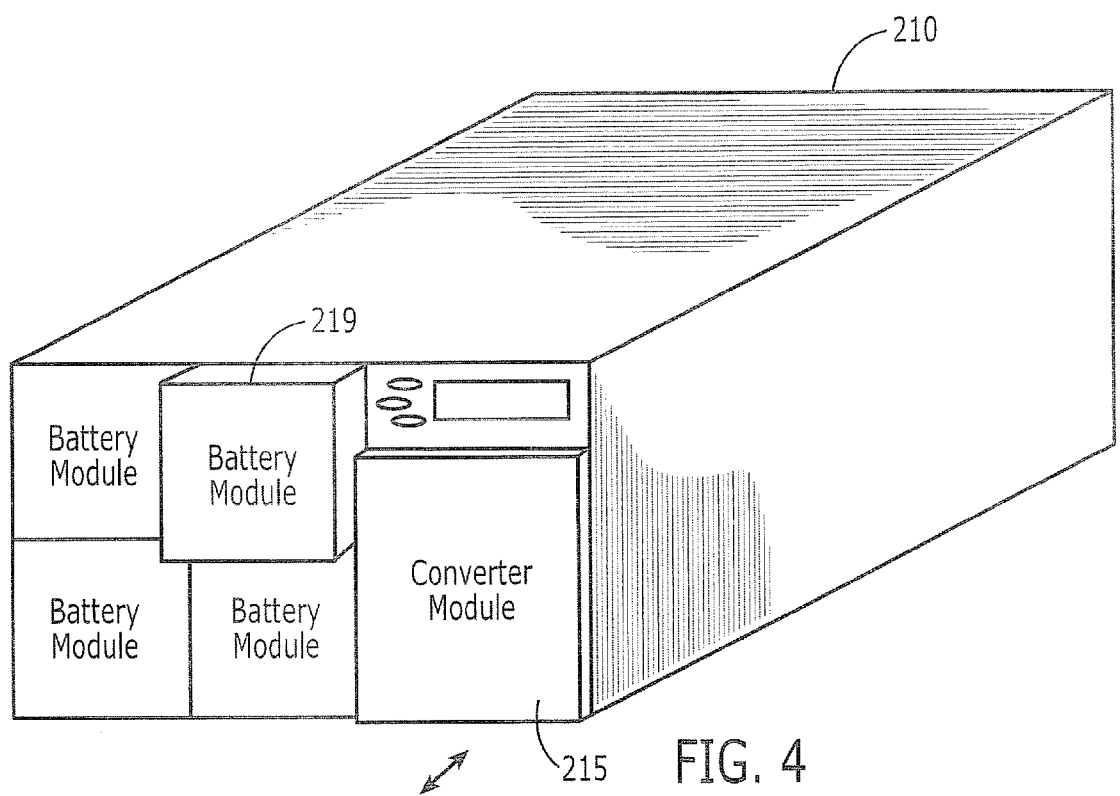
FIG. 4 is a perspective view of an in-rack power distribution unit according to some embodiments of the present invention.

Referring to FIGS. 3 and 4, which illustrate details of a modular UPS 210 according to some embodiments of the present invention, at least one first conductor of the first connector 212 is coupled to an input 211 of a converter module 215. The converter module 215 includes on-line UPS power conversion circuits, including a rectifier 216, an inverter 217 and a battery converter 218. The rectifier 216 is configured to rectify AC input power received via the first connector 212, producing a DC output that is provided to the inverter 217. The battery converter 218 supports power flow between a battery module 219 and the DC link between the rectifier 216 and the inverter 217. An output 213 of the converter module 215 is coupled to at least one conductor of the second connector 214 and to at least one second conductor of the first connector 212. The inverter 217 generates AC power at the converter module output 213 from DC power supplied from the rectifier 216 and/or from the battery converter 218.

Referring to FIGS. 2-4, the battery module 219 and/or the converter module 215 may be removable, e.g., for repair or replacement. Due to the internal output connections in the UPS 210, deactivation of the UPS 210 and removal of the converter module 215 and/or the battery modules 219 does not interrupt the paralleled output connection between the first and second connectors 212, 214. Accordingly, while a UPS 210 is inactive and has a module removed therefrom, other UPSs 210 connected to the connectorized bus assembly 220 may provide power to the PDU 110 to which the inactive UPS 210 is directly connected via its second connector 214.

Figure 5:
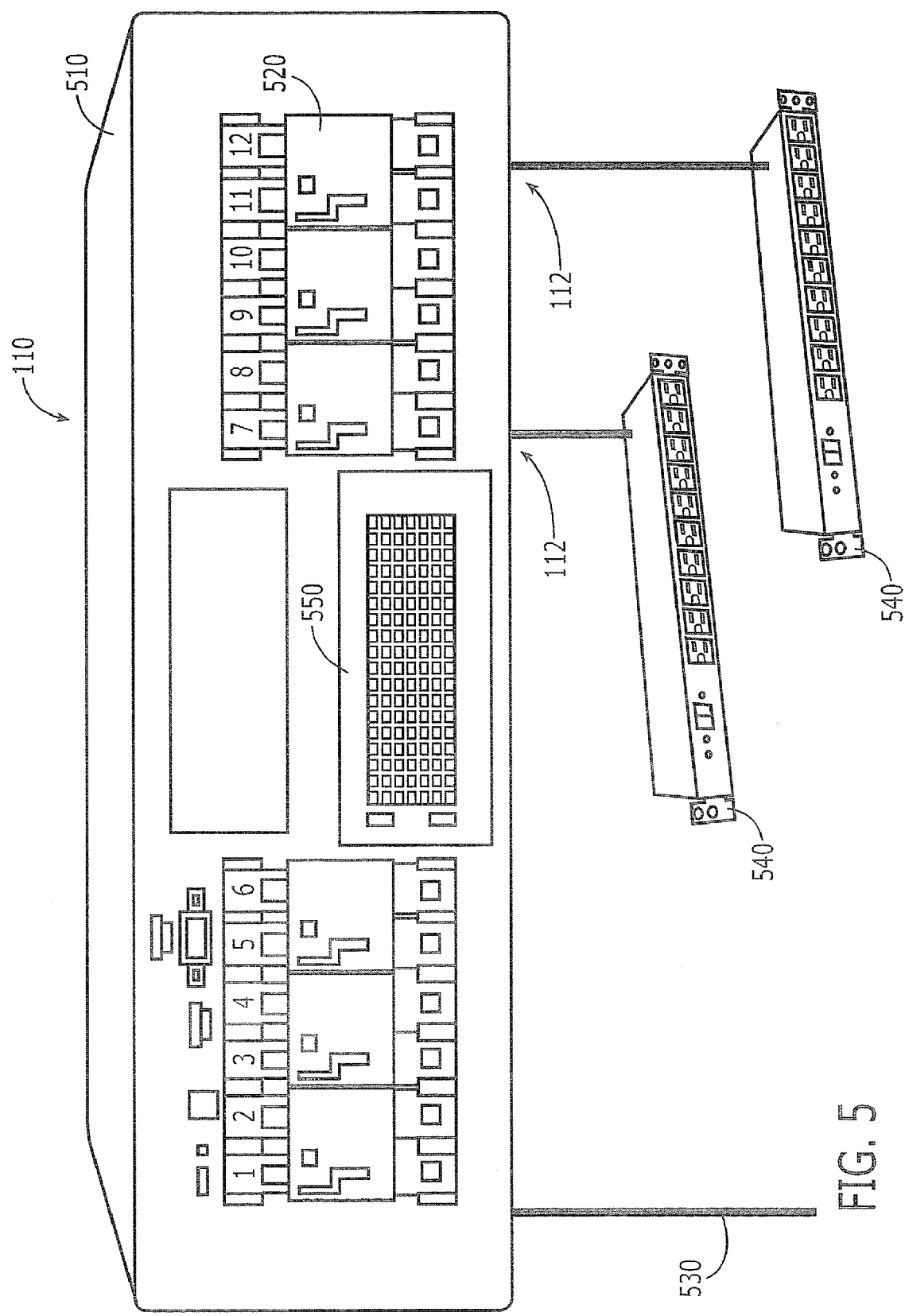
FIGS. 5-10 illustrates various arrangements of equipment racks and power supply systems components according to some embodiments of the present invention.

FIG. 5 illustrates an exemplary implementation of a PDU 110 according to some embodiments of the present invention. The PDU 110 includes a housing 510 configured to be mounted in a rack. A plurality of circuit breakers 520 are mounted in the housing 510, and are configured to connect and disconnect a power input 530 of the PDU 110 to and from respective branch circuit outputs 112. As shown in FIG. 5, respective power outlet assemblies (e.g., outlet strips) 540 may be coupled to respective ones of the branch circuit outputs 112. In the PDU 110 shown in FIG. 5, a branch circuit load indicator display 550 is also provided at a front face of the PDU 110.

Figure 6:
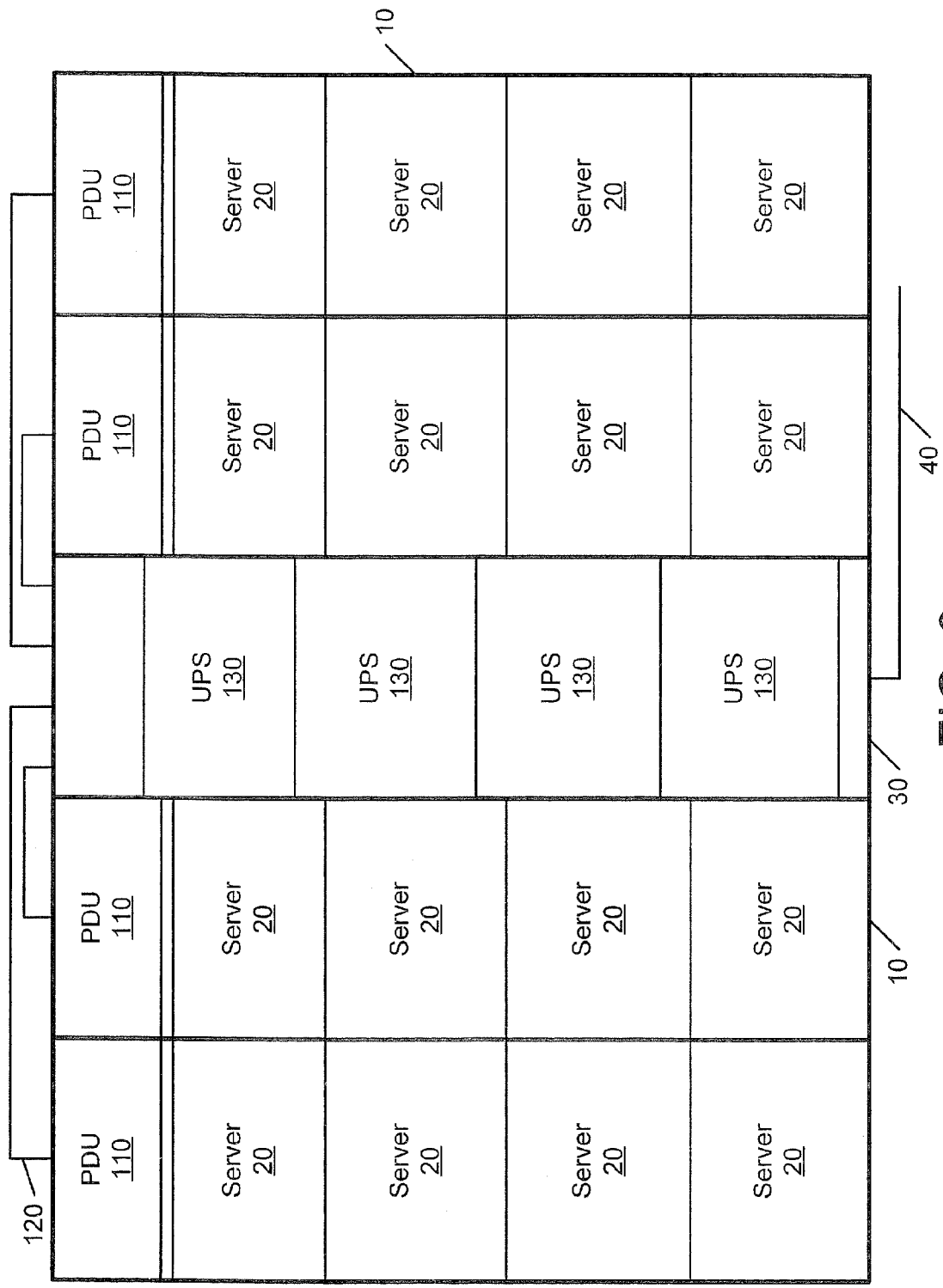
Figure 7:
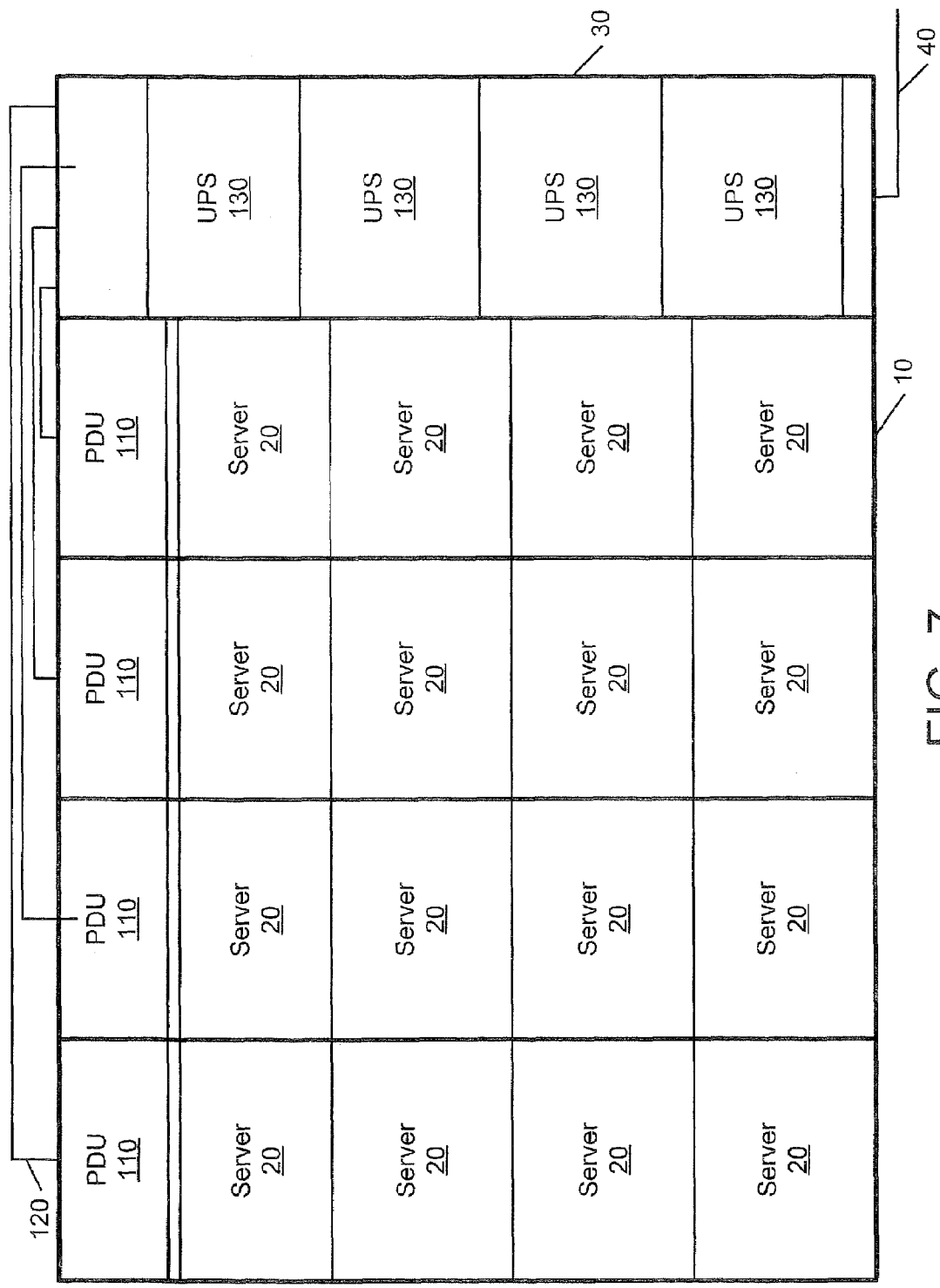

FIGS. 6-10 illustrate a number of different arrangements of equipment racks and power supply apparatus according to various embodiments of the present invention. Referring to FIG. 6, in a "center of row" configuration, a UPS rack 30 may be positioned in a row with equipment racks 10 arrayed on respective sides thereof. FIG. 7 illustrates another, "end of row" configuration.

Figure 8:
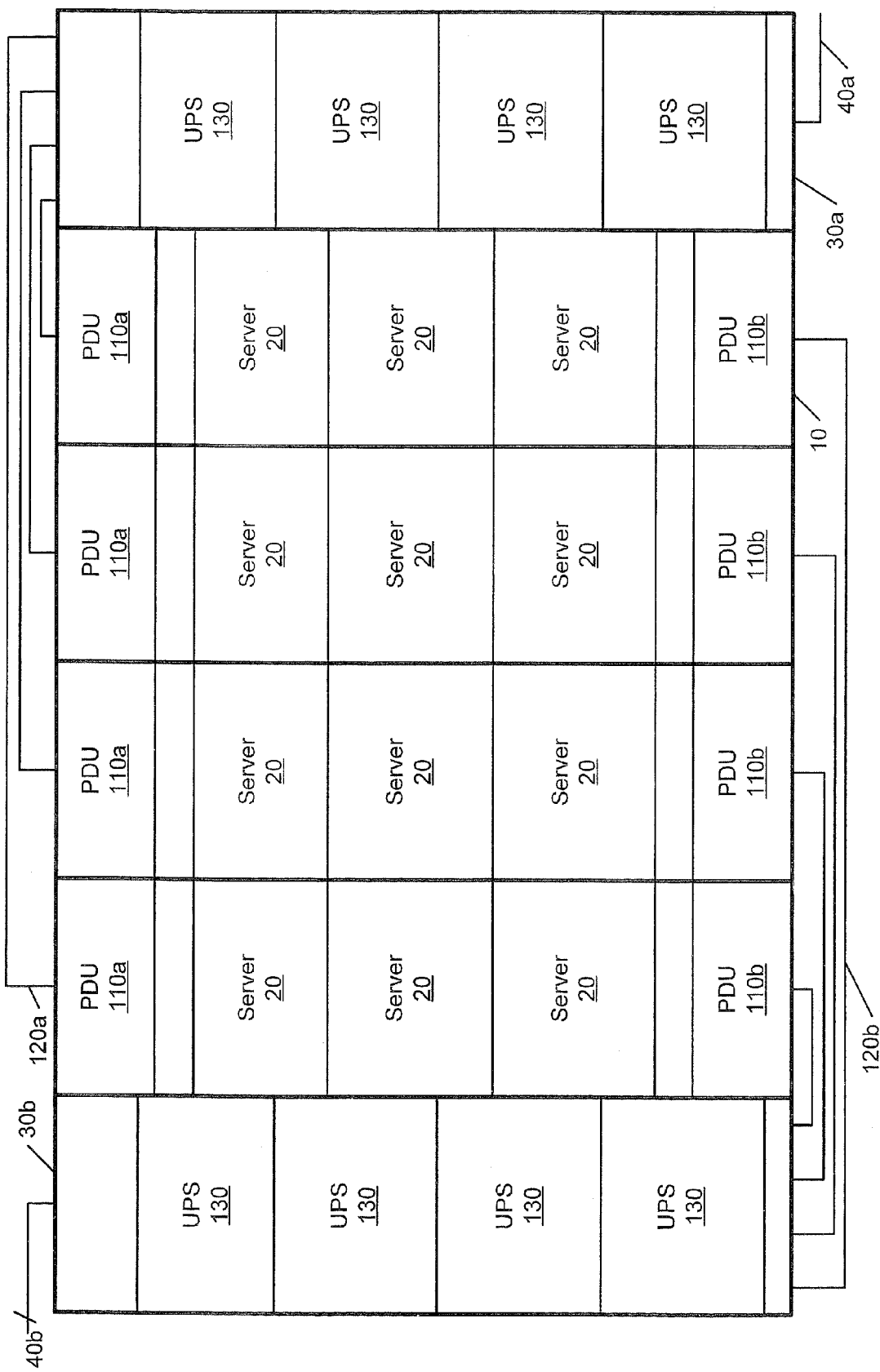

Some embodiments of the present invention can support redundant power supply. As known to those skilled in the art, some data center equipment, such as servers, may include dual power inputs to allow the equipment to be powered from redundant power sources. Referring to FIG. 8, according to some embodiments of the present invention, first and second UPS racks 30a, 30b fed by first and second power sources over power inputs 40a, 40b may be provided for a group of equipment racks 10, each of which include first and second PDUs 110a, 110b. The PDU's 110a, 110b may be connected to dual power inputs of equipment in the rack, e.g., server modules 20 with dual power inputs. In the illustrated embodiments, the first PDUs 110a are connected to respective UPSs 130 in the first UPS rack 30a by respective power cables 120a, and the second PDUs 110b are connected to respective UPSs 130 in the second UPS rack 30b by respective power cables 120b.

Figure 9:
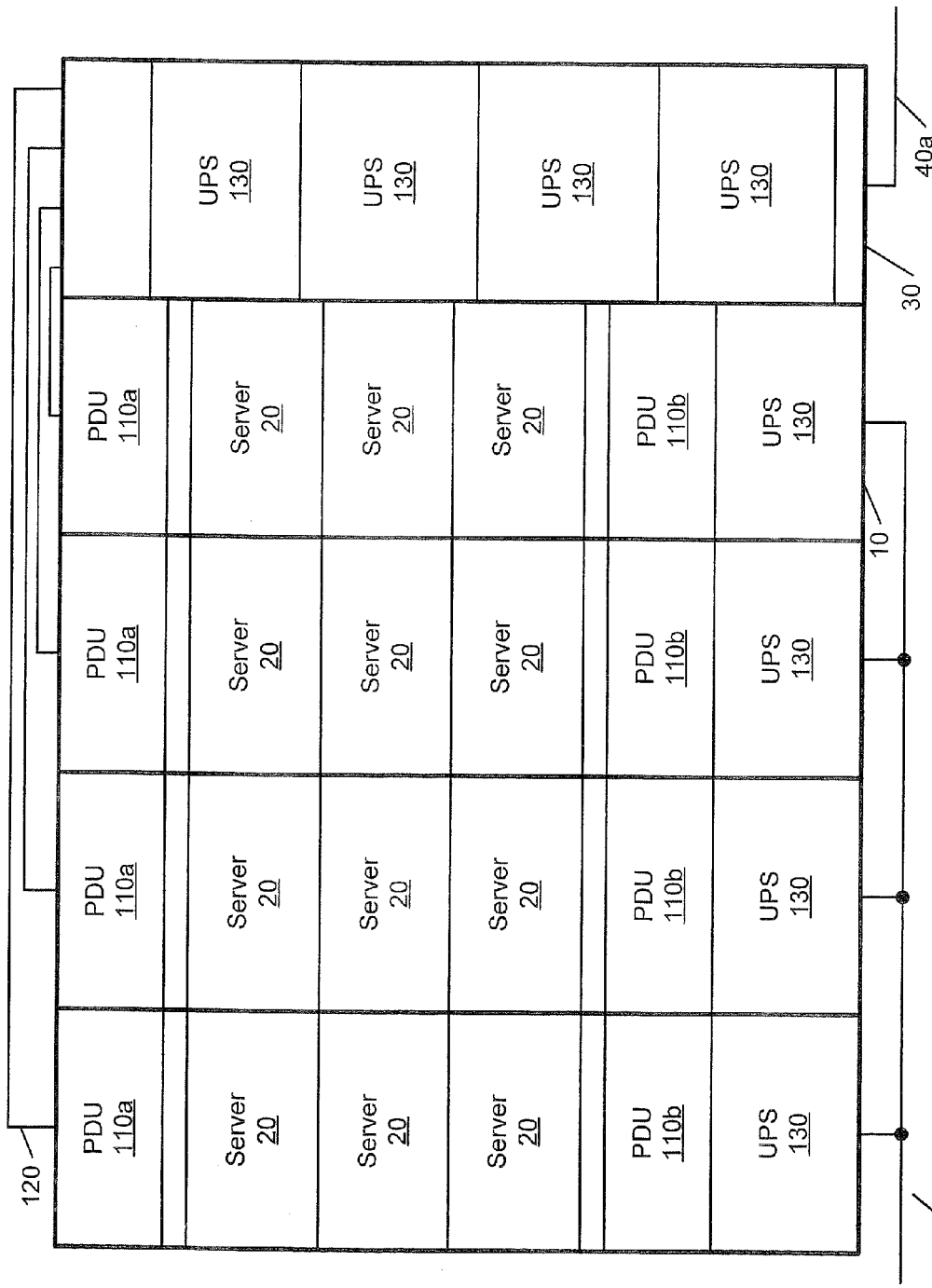

FIG. 9 illustrates a redundant arrangement in which equipment racks 10 each include first and second PDUs 110a, 110b. The first PDUs 110a are connected to respective ones of UPSs mounted in a UPS rack 30 fed from a first power source at a power input 40a. Respective UPSs 130 fed from a second power source via a power input 40b are also mounted in the equipment racks 10 and are connected to respective ones of the second PDUs 110b. The first and second PDUs 110a, 110b may provide power to dual-input server modules 20 in the equipment racks 10.

Figure 10:
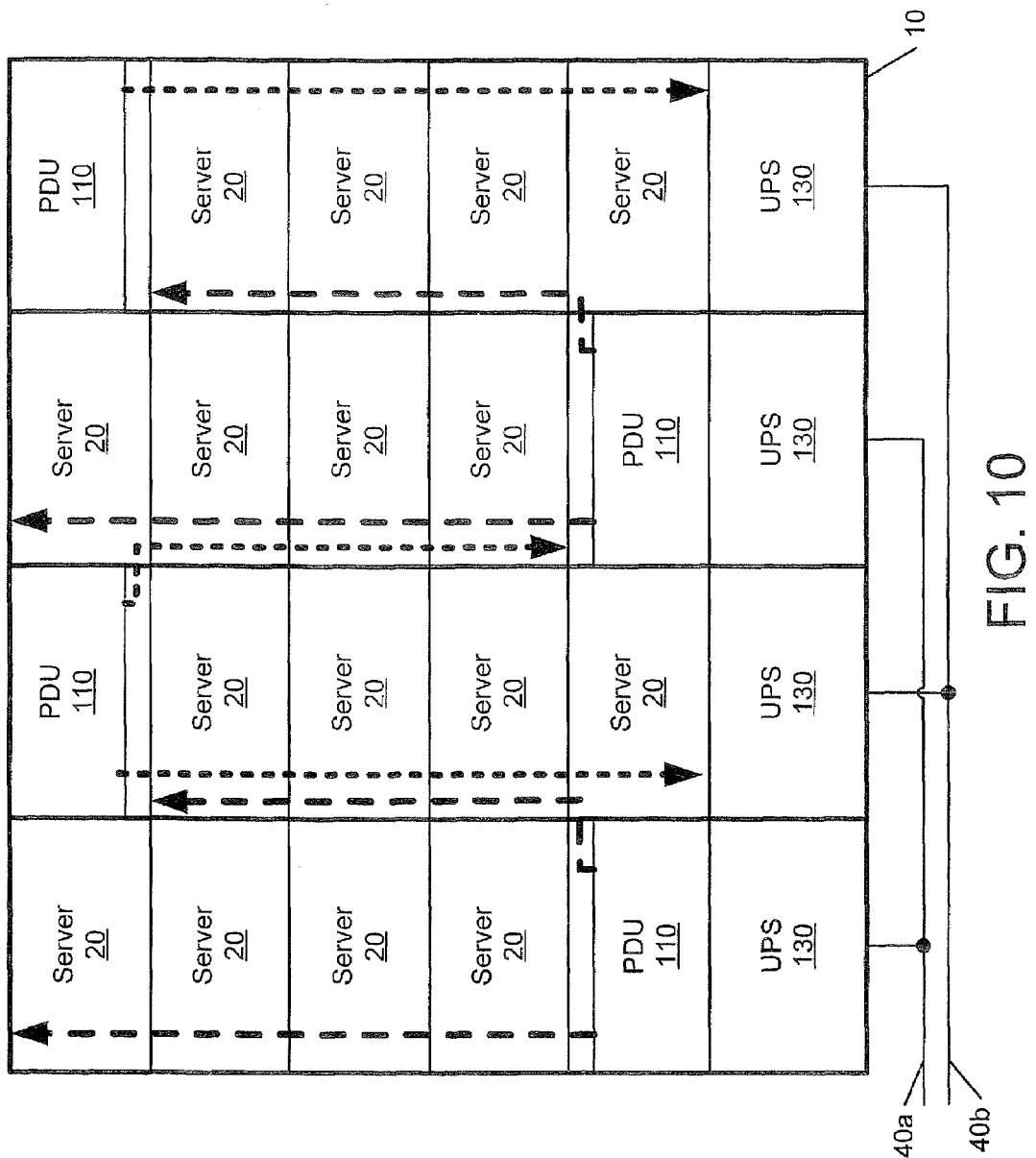

FIG. 10 illustrates another redundant configuration according to some embodiments of the present invention wherein respective UPSs 130 are mounted in respective equipment racks 10 and are fed from either a first or second power supply 40a, 40b. The UPSs 130 provide power to respective PDUs 110 mounted in the racks 10 with the UPSs 130. As shown, the PDUs 110 in each rack may supply power to dual-input server modules 20 mounted in the rack and to server modules 20 mounted in an adjacent rack. In this manner, redundant power may be provided to the server modules 20.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed:

1. A power system, comprising:
   a plurality of power distribution units (PDUs), respective ones of the PDUs configured to be mounted in respective ones of a plurality of equipment racks and each of the PDUs configured to distribute power to equipment mounted in the respective corresponding equipment rack in which the PDU is mounted via plural branch circuit outputs; and
   a plurality of uninterruptible power supplies (UPSs) configured to be mounted together in a single UPS rack and to be directly connected to inputs of respective ones of the PDUs via respective power cables.

2. The system of claim 1, wherein the UPSs are configured to be output-paralleled at the UPS rack.

3. The system of claim 2, wherein each UPS includes a first output connector configured to be directly connected to a PDU via a power cable, and a second output connector configured to be coupled to a second connector of another UPS to provide output paralleling.

4. The system of claim 2, further comprising a connectorized bus assembly configured be mounted in the UPS rack, the connectorized bus assembly comprising a UPS output bus and a plurality of connectors, respective ones of the connectors configured to couple the UPS output bus to the outputs of respective ones of the UPSs.

5. The system of claim 4, wherein the UPSs are configured to be input-paralleled at the UPS rack, wherein the connectorized bus assembly further comprises a UPS input bus and wherein the respective ones of the plurality of connectors are further configured to couple the UPS input bus to inputs of respective ones of the UPSs.

6. The system of claim 4, wherein each of the UPSs comprises a first output connector configured to mate with a connector of the connectorized bus assembly and a second output connector configured to mate with a connector of one of the power cables.

7. The system of claim 1, further comprising a plurality of outlet assemblies configured to be mounted in an equipment rack, respective ones of the outlet assemblies configured to be coupled to respective ones of the branch circuit outputs of a PDU in the equipment rack.

8. The system of claim 1, wherein each of the PDUs comprises respective circuit interruption devices coupled between the input of the PDU and the branch circuit outputs thereof.

9. The system of claim 1, wherein respective ones of the plurality of UPSs comprise respective batteries.

10. The system of claim 1, wherein respective ones of the plurality of UPSs comprise respective bypasses.

11. The system of claim 1, wherein each of the UPSs comprises at least one removable module, and wherein the outputs of the UPSs are configured to be output paralleled in the UPS rack such that power supply to a PDU coupled to a UPS is maintained while the at least one removable module of the UPS is absent.

12. The system of claim 11, wherein the at least one removable module comprises a battery module and/or a power converter module.

13. A system, comprising:
a plurality of equipment racks;
a plurality of PDUs, respective ones of the PDUs mounted in respective ones of the plurality of equipment racks and each of the PDUs configured to distribute power to equipment mounted in the respective corresponding equipment rack in which the PDU is mounted via plural branch circuit outputs;
a UPS rack;
a plurality of UPSs mounted !together in the UPS rack; and
a plurality of power cables directly coupling outputs of respective ones of the UPSs to inputs of respective ones of the PDUs.

14. The system of claim 13, wherein the UPSs are output paralleled in the UPS rack.

15. The system of claim 14, further comprising a connectorized bus assembly mounted in the UPS rack, the connectorized bus assembly comprising a UPS output bus and a plurality of connectors, respective ones of the connectors coupling the UPS output bus to the outputs of respective ones of the UPSs.

16. The system of claim 15, wherein the UPSs are input-paralleled at the UPS rack, wherein the connectorized bus assembly further comprises a UPS input bus and wherein the respective ones of the plurality of connectors couple the UPS input bus to inputs of respective ones of the UPSs.

17. The system of claim 15, wherein each of the UPSs comprises a first output connector mated with a connector of the connectorized bus assembly and a second output connector mated with a connector of one of the power cables.

18. The system of claim 13, further comprising a plurality of outlet assemblies mounted in an equipment rack, respective ones of the outlet assemblies coupled to respective ones of the branch circuit outputs of a PDU in the equipment rack.

19. The system of claim 13:
wherein the plurality of PDUs comprises respective pairs of first and second PDUs mounted in respective ones of the equipment racks, the first and second PDUs configured to distribute power to equipment via respective first and second pluralities of branch circuit outputs;
wherein the UPS rack comprises first and second UPS racks;
wherein the plurality of UPSs comprises a first plurality of UPSs mounted in the first UPS rack and a second plurality of UPSs mounted in the second UPS rack; and
wherein the plurality of power cables comprises a first plurality of power cables coupling outputs of respective ones of the first plurality of UPSs to inputs of respective ones of the first PDUs and a second plurality of power cables coupling outputs of respective ones of the second plurality of UPSs to inputs of respective ones of the second PDUs.

20. The system of claim 13, wherein the plurality of PDUs comprises a plurality of pairs of first PDUs and second PDUs, respective ones of the pairs of first and second PDUs mounted in respective ones of the equipment racks, wherein the plurality of UPSs comprises a first plurality of UPSs mounted in the UPS rack, and wherein the system further comprises a second plurality of UPSs, respective ones of which are mounted in respective ones of the equipment racks, wherein outputs of respective ones of the second plurality of UPSs are connected to inputs of respective ones of the second PDUs.

21. The system of claim 13, wherein respective ones of the plurality of UPSs comprise respective batteries.

22. The system of claim 13, wherein respective ones of the plurality of UPSs comprise respective bypasses.

23. The system of claim 13, wherein each of the UPSs comprise at least one removable module, and wherein the outputs of the UPSs are output paralleled in the UPS rack such that power supply to a PDU coupled to a UPS is maintained while the at least one removable module of the UPS is absent.

24. The system of claim 23, wherein the at least one removable module comprises a battery module and/or a power converter module.

25. The system of claim 13, wherein each of the UPSs has a load rating corresponding to a load of an individual one of the equipment racks.

26. A method of fabricating infrastructure for equipment, the method comprising:
mounting respective PDUs in respective ones of a plurality of equipment racks, each of the PDUs configured to distribute power to equipment mounted in the respective corresponding equipment rack in which the PDU is mounted via plural branch circuit outputs;
mounting a plurality of UPSs together in a UPS rack; and
connecting respective power cables between outputs of respective ones of the UPSs and inputs of respective ones of the PDUs.

27. The method of claim 26, further comprising output paralleling the UPSs at the UPS rack.

28. The method of claim 27, further comprising:
mounting a connectorized bus assembly in the UPS rack, the connectorized bus assembly comprising a UPS output bus and a plurality of connectors coupled to the UPS output bus; and
coupling respective ones of the connectors to the outputs of respective ones of the UPSs.

29. The method of claim 26, further comprising mounting a plurality of outlet assemblies in an equipment rack and coupling respective ones of the outlet assemblies to respective ones of the branch circuit outputs of a PDU in the equipment rack.

30. The method of claim 26:
wherein mounting respective PDUs in respective ones of a plurality of equipment racks, each of the PDUs configured to distribute power to equipment mounted in the respective corresponding equipment rack in which the PDU is mounted via plural branch circuit outputs thereof comprises mounting respective pairs of first and second PDUs mounted in respective ones of the equipment racks, the first and second PDUs configured to distribute power to equipment via respective first and second pluralities of branch circuit outputs;
wherein mounting a plurality of UPSs together in a UPS rack comprises mounting a first plurality of UPSs together in a first UPS rack and mounting a second plurality of UPSs together in a second UPS rack; and
wherein connecting respective power cables between outputs of respective ones of the UPSs and inputs of respective ones of the PDUs comprises connecting respective power cables between outputs of respective ones of the first plurality of UPSs and inputs of respective ones of the first PDUs and connecting respective power cables between outputs of respective ones of the second plurality of UPSs and inputs of respective ones of the second PDUs.

31. The method of claim 26, wherein mounting respective PDUs in respective ones of a plurality of equipment racks, each of the PDUs configured to distribute power to equipment mounted in the respective corresponding equipment rack in which the PDU is mounted via plural branch circuit outputs thereof comprises mounting respective pairs of first and second PDUs mounted in respective ones of the equipment racks, the first and second PDUs configured to distribute power to equipment via respective first and second pluralities of branch circuit outputs and wherein connecting respective power cables between outputs of respective ones of the UPSs to inputs of respective ones of the PDUs comprises connecting respective power cables between outputs of respective ones of the UPSs to inputs of respective ones of the first PDUs, and wherein the method further comprises:

mounting respective UPSs in respective ones of the equipment racks; and coupling outputs of respective ones of the UPSs mounted in the equipment racks to inputs of respective ones of the second PDUs.

* * * * *

UNITED STATES PATENT AND TRADEMARK OFFICE
CERTIFICATE OF CORRECTION

PATENT NO. : 7,561,411 B2  Page 1 of 1
APPLICATION NO. : 11/689087
DATED : July 14, 2009
INVENTOR(S) : Johnson, Jr.

It is certified that error appears in the above-identified patent and that said Letters Patent is hereby corrected as shown below:

Column 6, Claim 4, Line 42: Please add -- to -- after "bus assembly configured"

Column 7, Claim 13, Line 21: Please delete "!" after "UPSs mounted"

Signed and Sealed this

Thirteenth Day of October, 2009

David J. Kappos
*Director of the United States Patent and Trademark Office*